United States Patent [19]
Cornett et al.

[11] Patent Number: 6,069,397
[45] Date of Patent: May 30, 2000

[54] INTEGRABLE USING AMORPHOUS MAGNETIC MATERIAL CIRCUIT INDUCTOR

[75] Inventors: Kenneth D. Cornett; E. S. Ramakrishnan, both of Coral Springs, Fla.; Gary H. Shapiro, Alburquerque, N.Mex.; Wei-Yean Howng, Coral Springs, Fla.

[73] Assignee: Motorola, Inc., Schaumburg, Ill.

[21] Appl. No.: 08/943,255

[22] Filed: Oct. 3, 1997

Related U.S. Application Data

[63] Continuation of application No. 08/642,748, May 3, 1996, abandoned.

[51] Int. Cl.$^7$ .................................................. H01L 29/41
[52] U.S. Cl. ............................................ 257/531; 257/516
[58] Field of Search .................................. 257/531, 528, 257/516, 379

[56] References Cited

U.S. PATENT DOCUMENTS

| | | | |
|---|---|---|---|
| 5,227,659 | 7/1993 | Hubbard | 257/531 |
| 5,396,101 | 3/1995 | Shiga | 257/531 |
| 5,453,316 | 9/1995 | Morii et al. | 428/210 |
| 5,530,415 | 6/1996 | Takaya et al. | 336/83 |

OTHER PUBLICATIONS

"Application of Thin–Film Inductors to LC Filters," by M. Yamaguchi, K. Ishihara and K.I. Arai published in the IEEE Transactions on Magnetics, vol. 29, No. 6, dated Nov. 1993, pp. 3222–3224.

"Magnetically Ordered Amorphous Copper Ferrite," by G. Srinivasan, Uma Maheshwar Rao, J. Zhao and N.S. Seehra published in the Applied Physics Letters, 59 (3), by the American Institute of Physics, in Jul. 1991, pp. 372–374.

"Magnetization and Ferromagnetic Resonance Studies on RF Sputtered Amorphous $BiFeO_3 -CuFe_2O_4$," by B. Uma Maheshwar Rao and G. Srinivasan published in the Journal of Magnetism and Magnetic Materials, 1992, pp. 249–254.

"Effects of Sputtering Atmospheres on Magnetic Properties of Amorphous Films of $BiFeO_3 -ZnFe_2O_4$," by B. Uma Maheshware Rao and G. Srinivasan published in the Journal of Magnetism and Magnetic Materials, 1992, pp. L228–L230.

Chikazumi, S., *Physics of Magnetism*, John Wiley & Sons, Inc., 1978, pp. 330–332, QC753.2.C47.

*Primary Examiner*—David Hardy
*Attorney, Agent, or Firm*—Andrew S. Fuller

[57] ABSTRACT

An integrable circuit inductor (220) is formed from a patterned conductive material (110) that has a major portion completely encapsulated by a material (221, 223) that is substantially electrically non-conductive, and that has a magnetic response at the operating frequency of the inductor (220). Preferably, an amorphous ferrite material is used for encapsulation, which provides a closed magnetic flux path for the inductor (220) when processing a signal at its operating frequency.

25 Claims, 2 Drawing Sheets

INTEGRABLE USING AMORPHOUS MAGNETIC MATERIAL CIRCUIT INDUCTOR

This is a continuation of application Ser. No. 08/642,748, filed May 3, 1996, and now abandoned.

TECHNICAL FIELD

This invention relates in general to inductors, and more particularly, to inductors used in integrated circuits.

BACKGROUND

Inductive components are needed on integrated circuits for a wide variety of applications. Inductors formed on radio frequency (RF) or microwave frequency integrated circuits generally require a large amount of die space to achieve any significant inductance. In addition to substantial space consumption, when compared to typical transistors, resistors, and capacitors, the performance of integrated inductors tend to be poor. Inductors are often implemented on integrated circuits using spiraled conductor lines. Planar spiral inductors are easily fabricated, requiring only a single patterned metal layer, which tends to be space efficient. U.S. Pat. No. 5,396,101, issued to Shiga on Mar. 7, 1995, for an Inductance Element, describes an integrated spiral inductor that incorporates a core portion to increase inductance and/or to reduce space consumption.

Despite these advances, inductors integrated on integrated circuit substrates, such as silicon and gallium arsenide, still consume substantial space for radio frequency and microwave frequency applications. It is therefore desirable to obtain a better performing inductor for integrated circuit applications.

DETAILED DESCRIPTION OF THE PREFERRED EMBODIMENT

Generally, the present invention provides an integrable circuit inductor, such as would be implemented on an integrated circuit substrate. The inductor has a conductive pattern, defining the inductor geometry, which is disposed within a material having a magnetic response at the operating frequency of the inductor. In the preferred embodiment, the inductor is implemented on a integrated circuit substrate by completely encapsulating a major portion of a spiral conductive pattern between layers of a amorphous ferrite material. The encapsulation provides a closed magnetic flux path for the inductor when processing a signal at its operating frequency. A ratio of magnetic material layer thickness to conductive pattern line width of between 0.5 and 10 is preferred.

Figure 1:
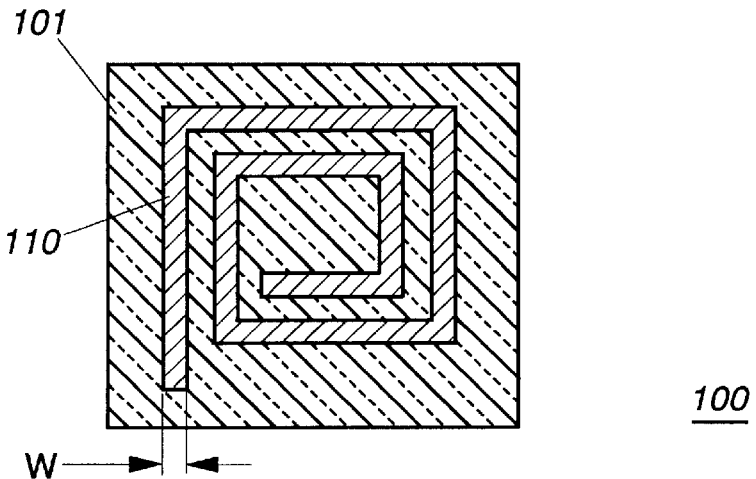
FIG. 1 is a plan view of a conductive pattern for a spiral inductor, in accordance with the present invention.

FIG. 1 shows a cross-sectional plan view 100 of conductive material 110 patterned on a substrate 101 to form an inductor, in accordance with the present invention. The conductive material 110 is a planar metal conductor trace formed in a spiral pattern. This conductor trace 110, also commonly referred to as the coil of the inductor, can be formed using standard thin-film fabrication techniques typically used to deposit conductor traces on an integrated circuit. In the preferred embodiment, the conductor trace 110 has a particular conductor line width (W), measured across a planar surface of the inductor.

Figure 2:
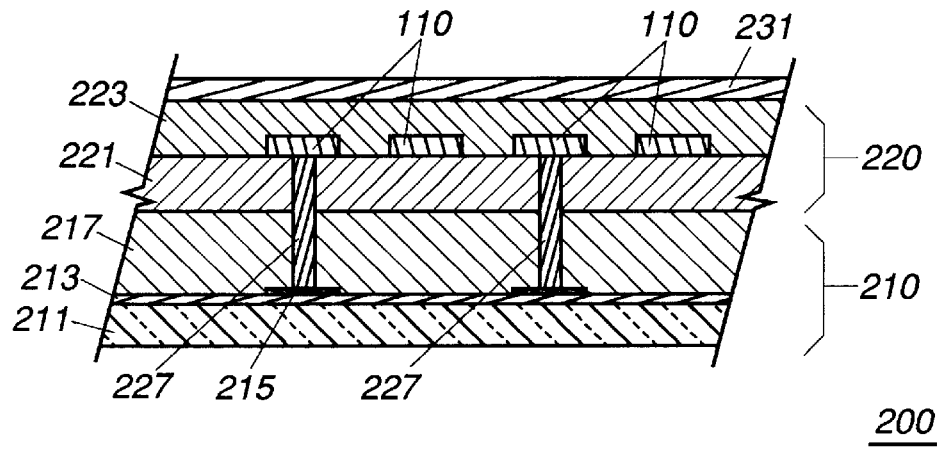
FIG. 2 is a cross-sectional view of a spiral inductor implemented on an integrated circuit substrate, in accordance with the present invention.

FIG. 2 is a cross-sectional side view of an integrated circuit 200 incorporating an inductor, in accordance with the present invention. The integrated circuit 200 has a layered construction which incorporates a circuit substrate layer 210, including a semiconductor substrate layer 211, a dielectric layer 213, a metal layer 215, and a passivation layer 217. The integrated circuit 200 further includes, according to the present invention, a circuit element such as an inductor 220 implemented as a layer of the integrated circuit 200. The inductor layer 220 includes the patterned conductive trace 110, such as in FIG. 1, embedded within layers of magnetic material 221, 223. The patterned conductive trace is electrically coupled to the circuit substrate layer 210 via conductive elements 227. The inductor layer forms a portion of the integrated circuit, and is preferably layered over the circuit substrate layer 210. An additional passivation layer 231 is included on top of the inductor layer 220.

The semiconductor substrate layer 211 forms the base upon which all the other layers of the integrated circuits are arranged. Common materials for forming the semiconductor substrate includes silicon, gallium arsenide, and ceramics. Metal layers 215 provide the basis for defining the circuitry of the integrated circuit. The circuitry may include elements such as transistors, resistors, capacitors, and the like. Integrated circuits often have multiple metal layers separated by dielectric material in order to accommodate more dense circuitry. The passivation layer 217 over the metal and dielectric layers 215, 213 is conventional.

According to the present invention, an inductor layer 220 is included on the integrated circuit 200 for implementing inductive circuit components. In the preferred embodiment, an inductor or inductance element is formed by embedding patterned inductive material within an insulative, i.e. nonconductive, magnetic material. The inductor is formed by depositing a first layer of magnetic material onto a layer, such as the passivation layer, of the integrated circuit. The patterned conductive trace is formed on this first layer, and the second layer of magnetic material is disposed on the first layer and on the patterned conductive trace. Preferably, the patterned conductive trace is formed along a plane normal to the stacked direction of the layers of the integrated circuit.

The magnetic material of the inductor layer 220 is selected to provide high permeability, low loss, and a high quality factor at the desired inductor operating frequencies, such as at radio or microwave frequencies. Accordingly, the preferred embodiment uses amorphous copper ferrite ($CuFe_2O_4$) material, which is electrically non-conductive or insulative, but which provides a magnetic response at radio or microwave frequencies. Other amorphous ferrite materials have been found to be suitable including amorphous compounds of $BiFeO_3$ such as $BiFeO_3$—$CuFe_2O_4$, and $BiFeO_3$—$ZnFe_2O_4$, and other like compositions.

In one experiment, inductors were fabricated using amorphous $CuFe_2O_4$ thin films, which resulted in a constant inductance up to frequencies greater than 3 gigahertz (GHz). These inductors also had a higher quality factor (Q). Generally, the inductor can be built using thin film deposition technology as a post-processing operation during the manufacture of the integrated circuit. The patterned conductive trace defining the structure of the inductor is embedded within the magnetic material, such that the magnetic material completely surrounded or encapsulated a major portion of the patterned conductive trace. In this embodiment, the magnetic material is completely encapsulates the conductor line or trace so as to provide separation between successive turns of inductor loop. The magnetic material provides a closed magnetic flux path for an inductance element embedded or encapsulated as described, when the inductance element is processing a signal at its operating frequency.

Figure 3:
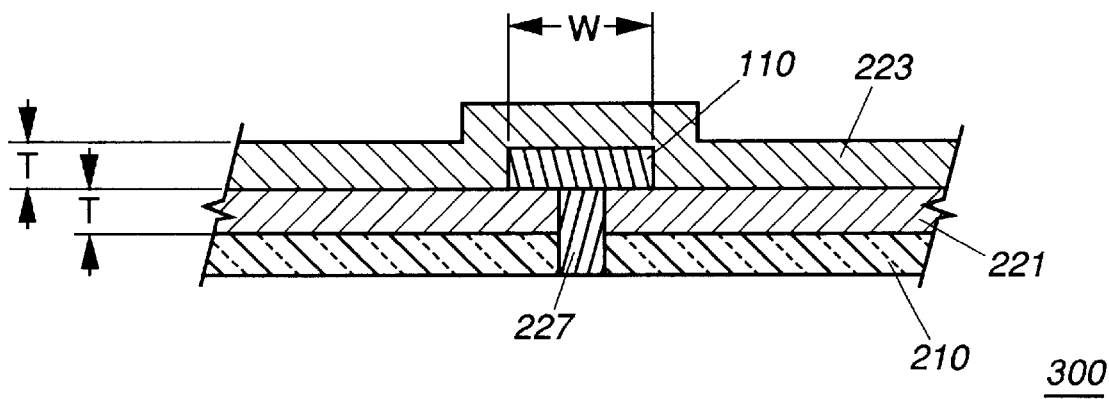
FIG. 3 is a fragmentary cross-sectional view of the integrated circuit inductor of FIG. 2, showing preferred dimensions, in accordance with the present invention.

Referring to FIG. 3, a fragmentary cross-sectional side view of the integrated circuit inductor is shown, in accordance with the present invention. As stated earlier, the planar spiral conductor pattern defining the inductor structure is sandwiched between two layers of insulative magnetic material. In the preferred embodiment, the dimensions of the thickness of the layers of magnetic material, as well as the width of the conductor used in the spiral inductor trace, are selected such that there is a particular ratio of magnetic material layer thickness to conductor line width. The thickness of the magnetic layer is measured along the stack direction of the layers of the integrated circuit, and the conductor line width is measured along a plane perpendicular to this stack direction. The conductor trace of the spiral has a particular conductor line width (W) in the preferred embodiment. The thickness (T) of each magnetic material layer sandwiching the conductor trace is selected to be between 0.5 and five times the conductor width, i.e., T=0.5 W–5 W. Thus, the ratio of magnetic layer thickness to conductor line width is between 0.5 and 5.

Figure 4:
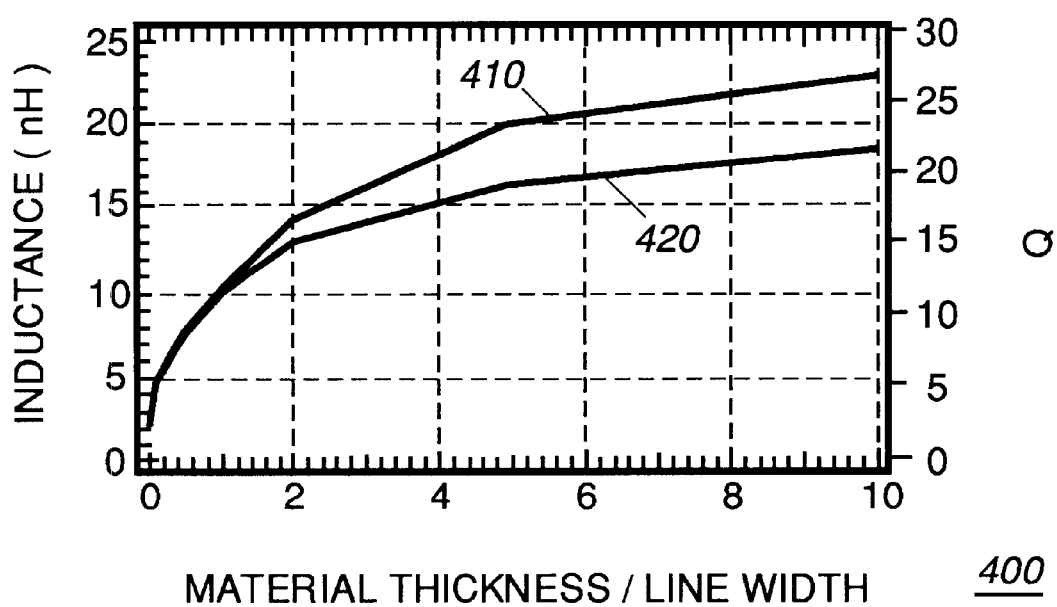
FIG. 4 is a graph showing inductance for various ratios of magnetic material thickness to conductor line width of a spiral inductor, in accordance with the present invention.

FIG. 4 is a graph 400 showing the impact of varying the ratio of magnetic material layer thickness to conductor line thickness for a particular inductor, in accordance with the present invention. Plots 410, 420 shows the change in inductance and quality factor, respectively, as the ratio of magnetic material thickness to conductor line width thickness is varied. The data corresponds to a typical spiral inductor, and magnetic material having a permeability of approximately 10. It can be seen that a significant increased in inductance and quality factor can be accomplished by forming an inductor using the concepts described herein. This increase is most dramatic for ratios of magnetic material layer thickness of up to 5 times the conductor line width thickness.

The present invention has broader applications than the particular embodiment described herein. For example, inductors having a variety of structures may be formed and significantly improved by embedding these structures between layers of magnetic material. Moreover, entire portions of circuits, including other circuit elements, may be sandwiched as described for improved performance. This includes other inductive structure, such as transformers, resonators, and the like.

The use of material that is magnetic at the operating frequency of the integrated circuit provides significant advantages. For example, there is a lowering of capacitive coupling between that portion of circuitry housed by the magnetic material and the semiconductor substrate. By confining the magnetic flux of the housed devices within the magnetic material, the magnetic flux is pulled out of the lossy semiconductor material. This results in an increased reactance, depending upon the relative permeability of the magnetic material used. Consequently, the inductance of circuit elements of a given design may be increased, or the space consumed on the integrated circuits for a device having a particular inductance may be decreased.

In the preferred embodiment the inductance element is completely surrounded by the magnetic material. However, significant benefits may be achieved by similarly encapsulating major portions of the inductance element, or major portions of entire circuitry on the integrated circuit.

What is claimed is:

1. An integrable circuit inductor comprising a patterned conductive material having a major portion completely encapsulated by an amorphous magnetic material that is substantially electrically non-conductive.

2. The integrable circuit inductor of claim 1, wherein the magnetic material comprises a ferrite material.

3. The integrable circuit inductor of claim 2, wherein the magnetic material comprises material selected from a group consisting of $CuFe_2O_4$, $BiFeO_3$—$CuFe_2O_4$, and $BiFeO_3$—$ZnFe_2O_4$.

4. The integrable circuit inductor of claim 2, wherein:
   the patterned conductive material comprises a planar conductor trace, with a particular conductor width, formed in a spiral pattern;
   the magnetic material has two layers each having a thickness of between 0.5 and 5 times the particular conductor width; and
   the planar conductor trace is sandwiched between the two layers of the magnetic material.

5. An integrated circuit inductor, comprising a substrate having a substantially amorphous magnetic material, and an inductance element having a major portion completely encompassed by the magnetic material.

6. The integrated circuit inductor of claim 5, wherein the substrate is formed from semiconductor material.

7. The integrated circuit inductor of claim 5, wherein the inductance element is embedded within, and is surrounded by the magnetic material.

8. The integrated circuit inductor of claim 5, wherein the inductance element is sandwiched between layers of the magnetic material.

9. The integrated circuit inductor of claim 5, wherein the magnetic material completely surrounds the inductance element.

10. The integrated circuit inductor of claim 5, wherein the magnetic material comprises amorphous ferrite material.

11. The integrated circuit inductor of claim 10, wherein the magnetic material comprises amorphous copper ferrite.

12. The integrated circuit inductor of claim 5, wherein the inductance element comprises a patterned conductive trace.

13. The integrated circuit inductor of claim 12, wherein the inductance element comprises a spiral conductor.

14. The integrated circuit inductor of claim 13, wherein the spiral conductor is planar.

15. An integrated circuit, comprising:
   a substrate;
   a first layer of amorphous magnetic material disposed on the substrate;
   a second layer of amorphous magnetic material disposed over the first layer of amorphous magnetic material; and
   a circuit element sandwiched between, and completely surrounded by the first and second layers of amorphous magnetic material.

16. The integrated circuit of claim 15, wherein the substrate is formed from semiconductor material.

17. The integrated circuit of claim 16, wherein the circuit element comprises an inductance element.

18. The integrated circuit of claim 17, wherein:
   the inductance element is formed by a conductor trace patterned into a planar spiral; and the first and second layers of amorphous magnetic material completely surround at least a major portion of the conductor trace.

19. The integrated circuit of claim 19, wherein the first and second layers of amorphous magnetic material comprise ferrite material.

20. The integrated circuit of claim 19, wherein the ferrite material comprise material selected from a group consisting of $CuFe_2O_4$, $BiFeO_3$—$CuFe_2O_4$, and $BiFeO_3$—$ZnFe_2O_4$.

21. The integrated circuit of claim 18, wherein the conductor trace has a particular line width, and the first and second layers of amorphous magnetic material each has a layer thickness of between 0.5 and 5 times the particular line width.

22. An integrated circuit having an inductance element operable at an operating frequency, comprising:

a semiconductor substrate; and amorphous magnetic material disposed on the semiconductor substrate;

wherein the inductance element is embedded within the magnetic material such that the amorphous magnetic material provides a closed magnetic flux path for the inductance element when processing a signal at the operating frequency.

23. The integrated circuit of claim 22, wherein the amorphous magnetic material comprises ferrite material.

24. The integrated circuit of claim 23, wherein the ferrite material comprises material selected from a group consisting of $CuFe_2O_4$, $BiFeO_3$—$CuFe_2O_4$, and $BiFeO_3$—$ZnFe_2O_4$.

25. The integrated circuit of claim 23, wherein:

the inductance element comprises a spiral inductor formed from a conductor having a particular cross-sectional width along a particular plane; and the conductor is sandwiched between first and second layers of the amorphous magnetic material each having a thickness of between one and five times the particular cross-sectional width measured perpendicular to the particular plane.

* * * * *